(12) United States Patent
Okabe et al.

(10) Patent No.: US 11,950,462 B2
(45) Date of Patent: Apr. 2, 2024

(54) DISPLAY DEVICE

(71) Applicant: SHARP KABUSHIKI KAISHA, Sakai (JP)

(72) Inventors: Tohru Okabe, Sakai (JP); Shinsuke Saida, Sakai (JP); Shinji Ichikawa, Sakai (JP); Hiroki Taniyama, Sakai (JP); Ryosuke Gunji, Sakai (JP); Kohji Ariga, Aioi (JP); Yoshihiro Nakada, Yonago (JP); Koji Tanimura, Yonago (JP); Yoshihiro Kohara, Yonago (JP); Akira Inoue, Yonago (JP); Hiroharu Jinmura, Yonago (JP); Takeshi Yaneda, Osaka (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 844 days.

(21) Appl. No.: 17/043,653

(22) PCT Filed: Mar. 30, 2018

(86) PCT No.: PCT/JP2018/013827
§ 371 (c)(1),
(2) Date: Sep. 30, 2020

(87) PCT Pub. No.: WO2019/187076
PCT Pub. Date: Oct. 3, 2019

(65) Prior Publication Data
US 2021/0036093 A1 Feb. 4, 2021

(51) Int. Cl.
*H10K 59/131* (2023.01)
*H10K 50/842* (2023.01)
*H10K 59/121* (2023.01)
*H10K 59/122* (2023.01)
(Continued)

(52) U.S. Cl.
CPC ....... *H10K 59/131* (2023.02); *H10K 50/8426* (2023.02); *H10K 59/1213* (2023.02); *H10K 59/122* (2023.02); *H10K 59/126* (2023.02); *H10K 59/18* (2023.02)

(58) Field of Classification Search
CPC ............. H10K 59/131; H10K 50/8426; H10K 59/1213; H10K 59/122; H10K 59/124; H10K 59/8722; H10K 59/126; H10K 59/18; H01L 27/124; G09F 9/30; H05B 33/02; H05B 33/06; H05B 33/12; H05B 33/22
See application file for complete search history.

(56) References Cited

U.S. PATENT DOCUMENTS

2010/0171105 A1 7/2010 Kim et al.
2017/0092177 A1* 3/2017 Kobayashi ............ G06F 1/1637
(Continued)

FOREIGN PATENT DOCUMENTS

JP 2010-161058 A 7/2010
JP 2018-063910 A 4/2018

*Primary Examiner* — Patricia D Valenzuela
(74) *Attorney, Agent, or Firm* — ScienBiziP, P.C.

(57) ABSTRACT

A first conductive layer in the same layer as that of a first electrode is coupled to a third conductive layer and a second electrode in the same layer as that of a third metal layer through a slit formed in a flattening film of a non-display area. Second conductive layers in the same layer as that of a second metal layer are provided to overlap with the slit.

18 Claims, 10 Drawing Sheets

(51) Int. Cl.
*H10K 59/126* (2023.01)
*H10K 59/18* (2023.01)

(56) References Cited

U.S. PATENT DOCUMENTS

2017/0262109 A1* 9/2017 Choi ............... H10K 59/122
2017/0279057 A1* 9/2017 Park ............... H10K 59/353

* cited by examiner ively supply constant voltage to a cathode of the OLED, a conductive layer at the lower layer of the flattening film needs to be coupled to the cathode through a slit provided in the flattening film. However, in a portion of the slit provided in the flattening film, the distance between the cathode or the conductive layer and a lead wiring line provided in a further lower layer of the conductive layer is short. Voltage different from the constant voltage supplied to the cathode is supplied to this lead wiring line. Thus, overlapping of these layers results in a problem in that the layers mutually impose influence of the capacity loads due to the voltage difference.

Solution to Problem

A display device according to one aspect of the disclosure to solve the problem described above includes, a display area including a plurality of subpixels each including a subpixel circuit including a transistor and a non-display area located in periphery of the display area, where a subpixel is not formed. In the display area, a first metal layer including an electrode at a lower layer included in the subpixel circuit, a first inorganic insulating film formed at an upper layer of the first metal layer, a second metal layer formed at an upper layer of the first inorganic insulating film and including an electrode, of electrodes included in the subpixel circuit, at an upper layer of the first metal layer, a second inorganic insulating film formed at an upper layer of the second metal layer, a third metal layer formed at an upper layer of the second inorganic insulating film and including an electrode, of the electrodes included in the subpixel circuit, at an upper layer of the second metal layer, a flattening film formed at an upper layer of the third metal layer, and a light-emitting element formed at an upper layer of the flattening film and including a first electrode and a second electrode with a light-emitting layer interposed between the first electrode and the second electrode, are formed, the first electrode is formed in an island shape for each of the plurality of subpixels, the second electrode is formed to extend across the plurality of subpixels. In the non-display area, a slit surrounding at least a part of an outer circumference of the display area is formed in the flattening film, in the slit, a lower face of a first conductive layer located in the same layer as a layer of the first electrode and separated from the first electrode is in contact with a third conductive layer formed by the third metal layer or the second inorganic insulating film, in the slit, the first conductive layer and a second conductive layer formed by the second metal layer overlap with the second inorganic insulating film interposed between the first conductive layer and the second conductive layer, the non-display area is further provided with a plurality of lead wiring lines including a wiring line formed by the first metal layer and electrically coupled to a wiring line in the display area, and in the slit, the plurality of lead wiring lines overlap with the second conductive layer with the first inorganic insulating film interposed between the plurality of lead wiring lines and the second conductive layer.

Advantageous Effects of Disclosure

With an aspect of the disclosure, the second conductive layer can block the influence of capacity loads to each of the first conductive layer provided in the slit and the lead wiring line due to a difference in voltage therebetween. Thus, the display device features an increased degree of freedom in the designing of the lead wiring line and can display high-quality image with no influence of noise.

DESCRIPTION OF EMBODIMENTS

First Embodiment

Overview of Display Device

Hereinafter, "the same layer" means that the layer is formed in the same process (film formation process), "a lower layer" means that the layer is formed in an earlier process than the process in which the layer to compare is formed, and "an upper layer" means that the layer is formed in a later process than the process in which the layer to compare is formed.

Figure 1:
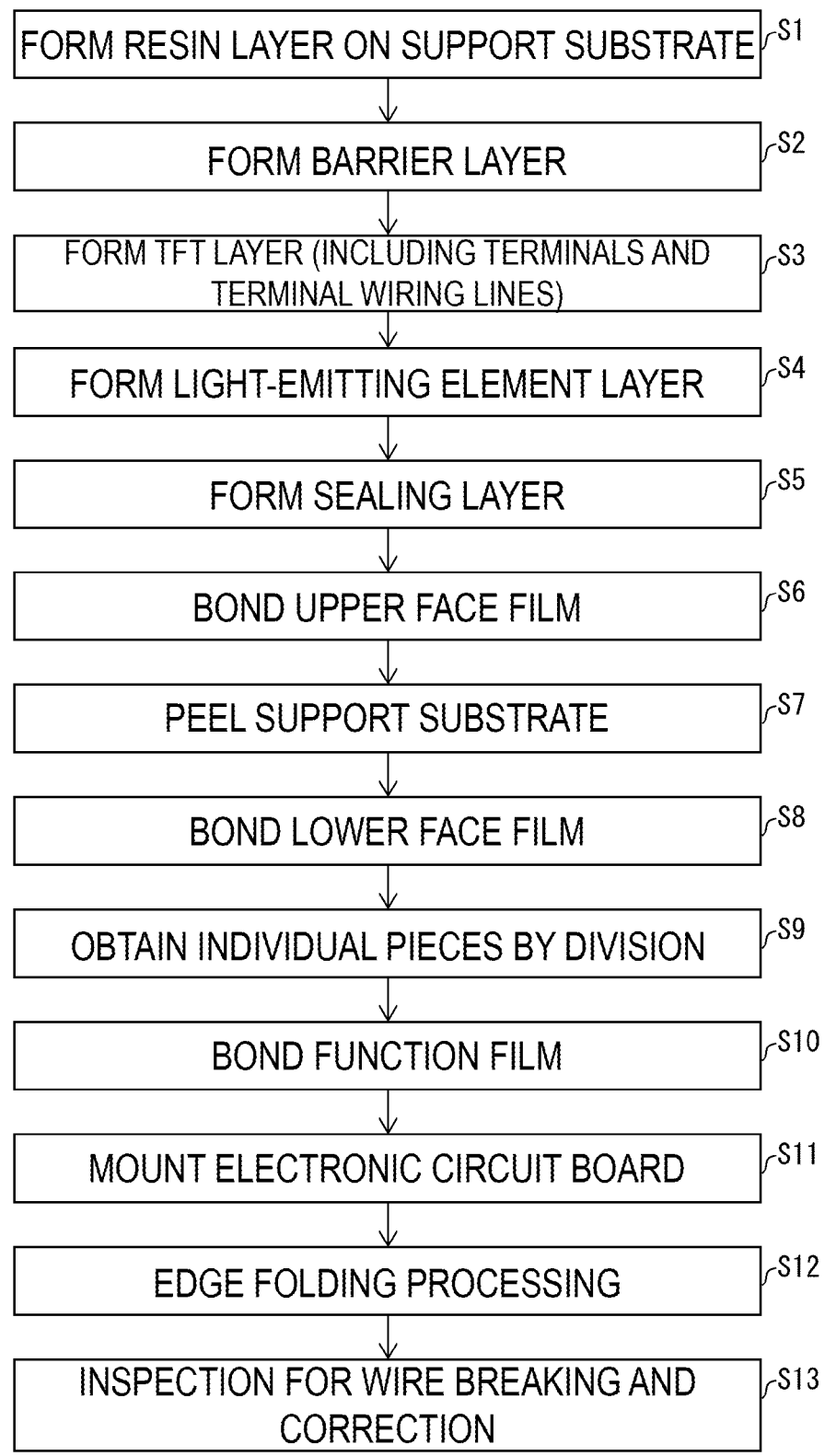
FIG. 1 is a flowchart illustrating a manufacturing method of a display device of a first embodiment.
Figure 2:
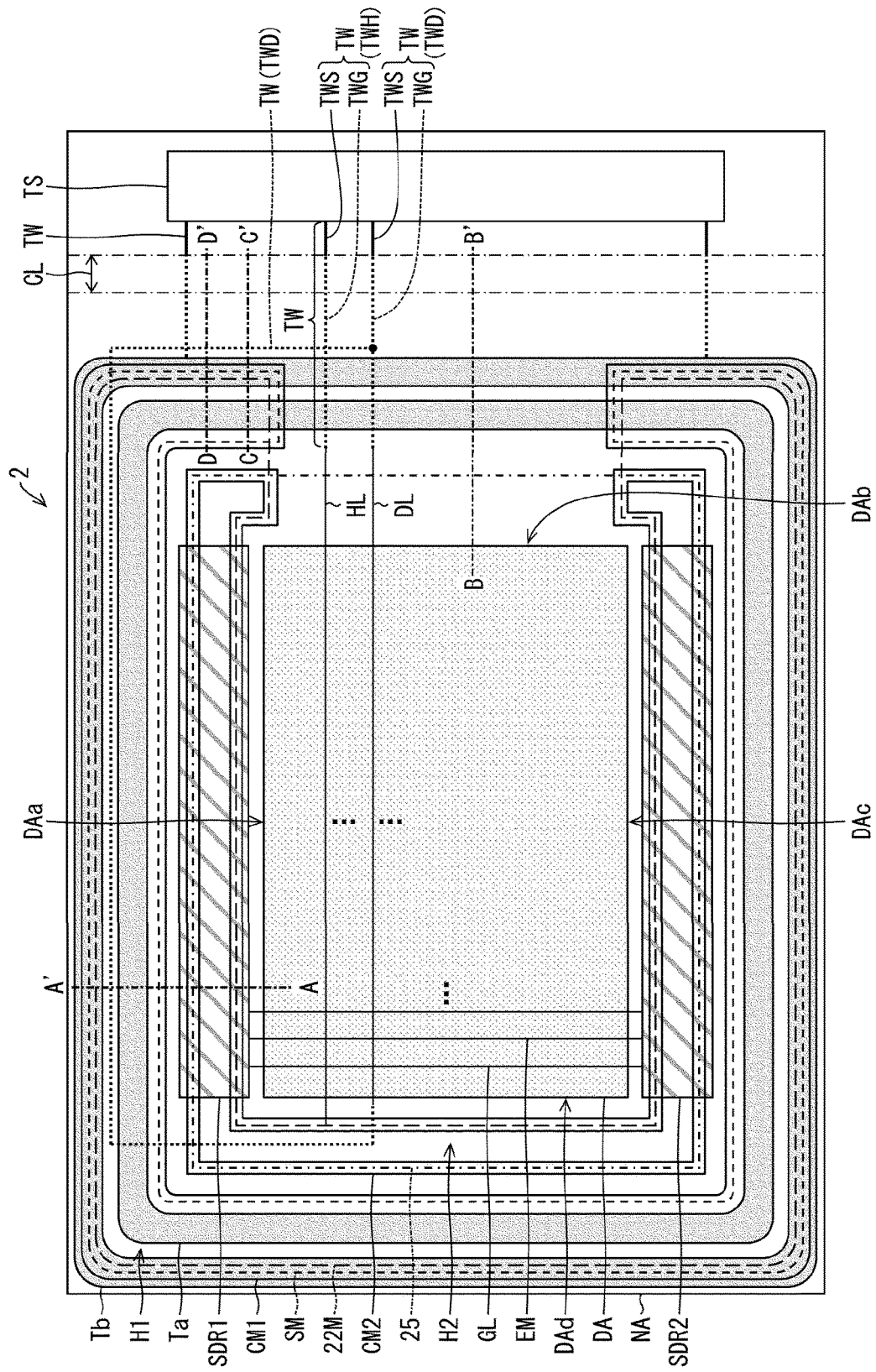
FIG. 2 is a plan view of the display device of the first embodiment.
Figure 3:
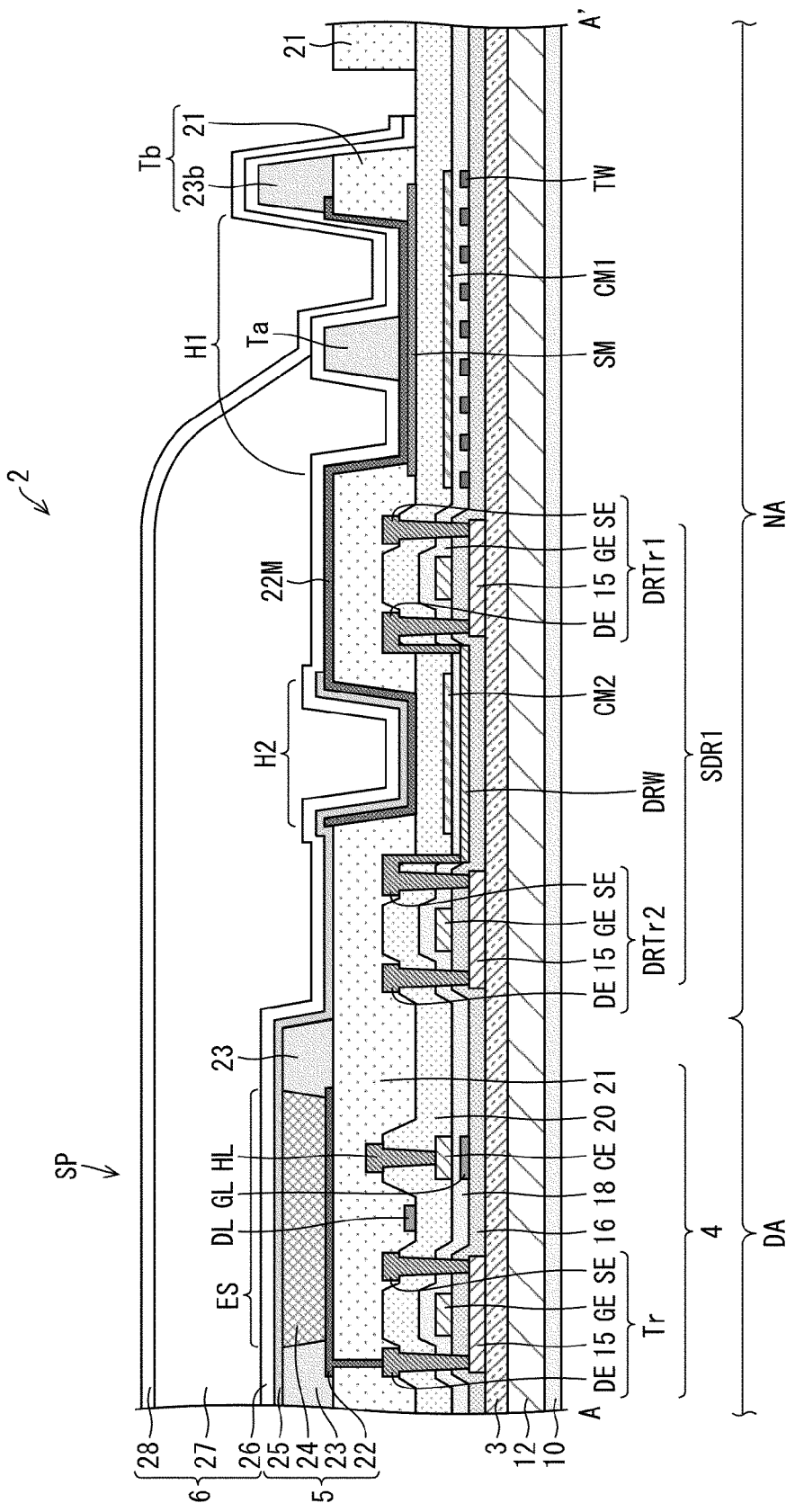
FIG. 3 is a cross-sectional view taken along line A-A' in FIG. 2.
Figure 4:
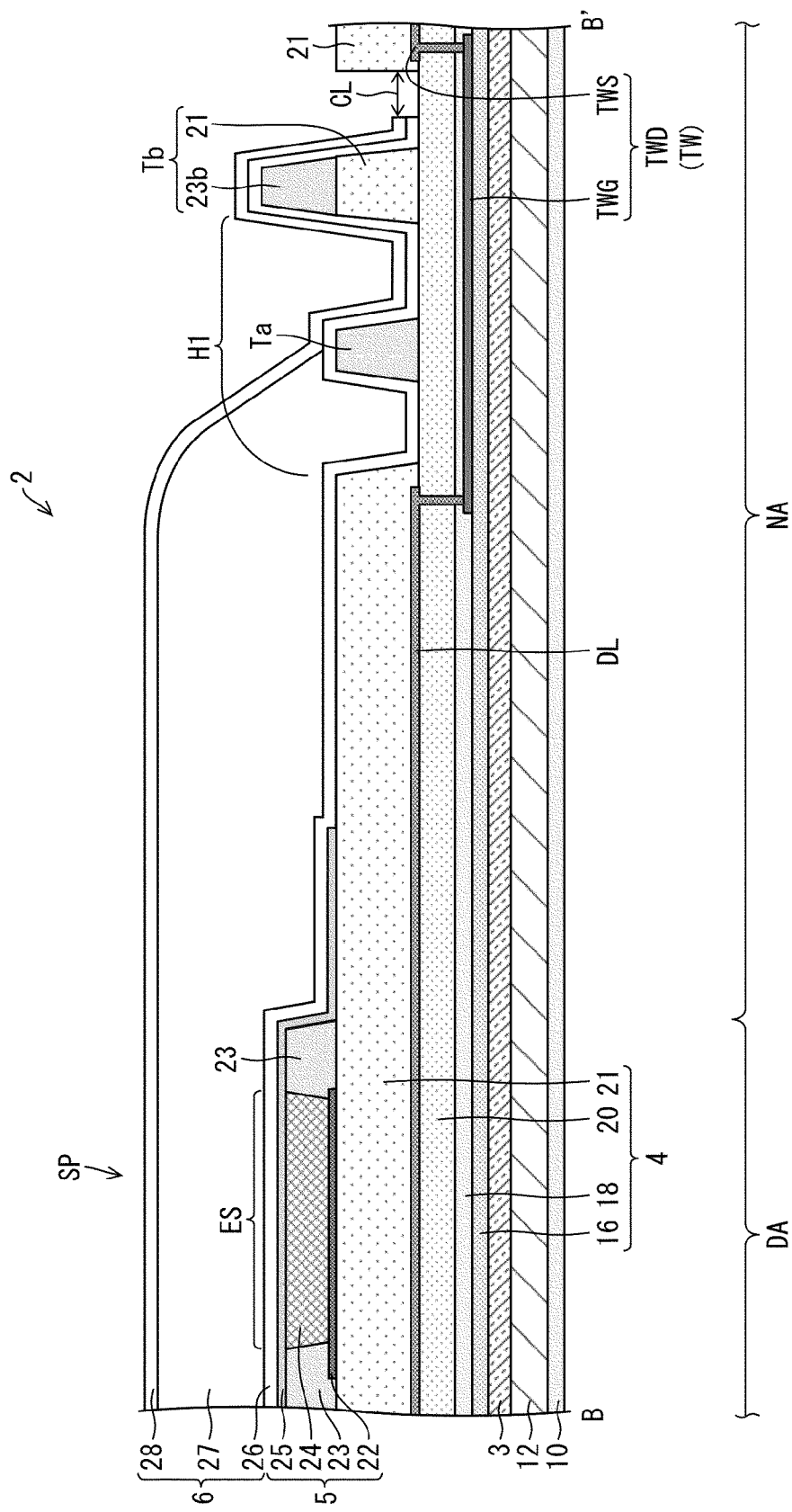
FIG. 4 is a cross-sectional view taken along line B-B' in FIG. 2.
Figure 5:
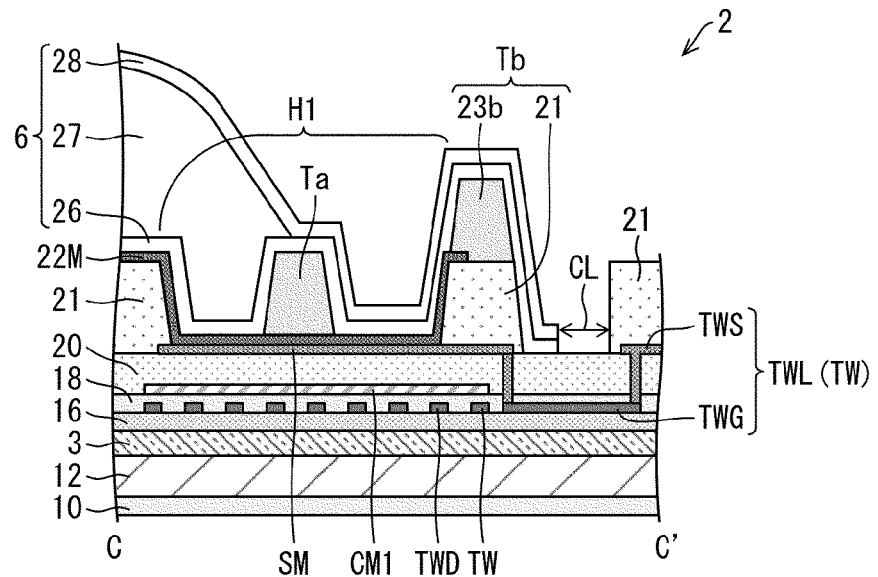
FIG. 5 is a cross-sectional view taken along line C-C' in FIG. 2.
Figure 6:
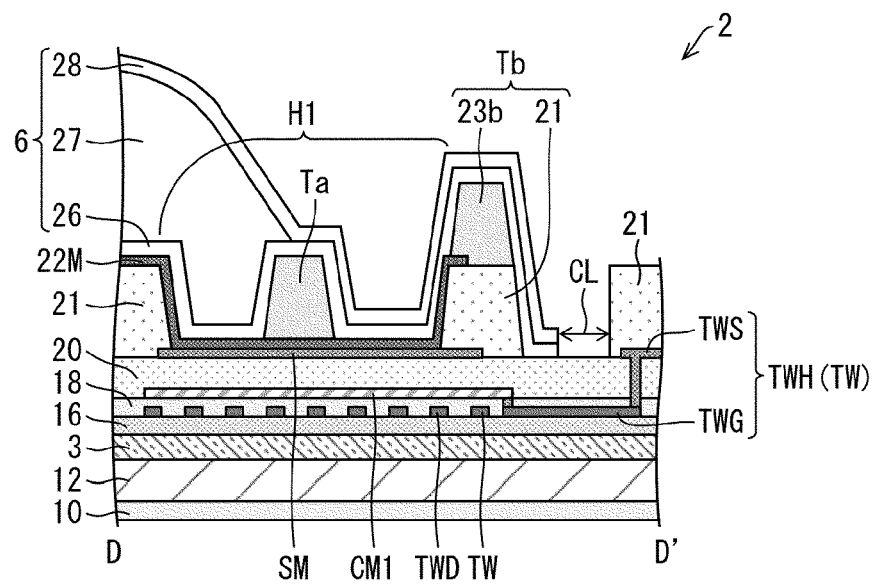
FIG. 6 is a cross-sectional view taken along line D-D' in FIG. 2.

FIG. 1 is a flowchart illustrating a manufacturing method of a display device of a first embodiment. FIG. 2 is a plan view of the display device of the first embodiment. FIG. 3 is a cross-sectional view taken along line A-A' in FIG. 4-2. FIG. 4 is a cross-sectional view taken along line B-B' in FIG. 2. FIG. 5 is a cross-sectional view taken along line C-C' in FIG. 2. FIG. 6 is a cross-sectional view taken along line D-D' in FIG. 2.

When a flexible display device is manufactured, as illustrated in FIGS. 1 to 6, a resin layer 12 is first formed on a transparent support substrate (for example, mother glass) (step S1). Next, a barrier layer 3 is formed (step S2). Next, a TFT layer 4 is formed (step S3). Next, a light-emitting element layer 5 that is a top-emitting type is formed (step S4). Next, a sealing layer 6 is formed (step S5). Next, an upper face film is bonded to the sealing layer 6 (step S6).

Next, the support substrate is peeled from the resin layer 12 by laser light irradiation and the like (step S7). Next, a lower face film 10 is bonded to the lower face of the resin layer 12 (step S8). Next, a layered body including the lower face film 10, the resin layer 12, the barrier layer 3, the TFT layer 4, the light-emitting element layer 5, and the sealing layer 6 is divided and a plurality of individual pieces are obtained (step S9). Next, a function film is bonded on the obtained individual pieces (step S10). Next, an electronic circuit board (for example, an IC chip and an FPC) is mounted on a terminal portion TS formed in an end portion, which is part of a non-display area NA (frame area), disposed more on the outer side than a display area DA in which a plurality of subpixels are formed (step S11). Next, edge folding processing (processing of bending a bending portion CL in FIG. 1 at a 180-degree) is performed to make a display device 2 (step S12). Next, an inspection for wire breaking is performed, and in a case where there is breaking of any wire, correction is performed (step S13). Note that steps S1 to S13 is performed by a display device manufacturing apparatus (including a layer forming apparatus that performs each of steps S1 to S5).

Examples of the material of the resin layer 12 include polyimide and the like. The portion of the resin layer 12 may be replaced by a two-layer resin film (for example, a polyimide film) and an inorganic insulating film sandwiched therebetween.

The barrier layer 3 is a layer for preventing foreign matters such as water and oxygen from entering the TFT layer 4 and the light-emitting element layer 5, and for example, can be formed of a silicon oxide film, a silicon nitride film, or a silicon oxynitride film, or a layered film of these formed by CVD.

The TFT layer 4 includes a semiconductor film 15, an inorganic insulating film 16 (a gate insulating film) at an upper layer of the semiconductor film 15, a gate electrode GE, a scanning signal line GL, and an light emission control line EM at an upper layer of the inorganic insulating film 16, an inorganic insulating film 18 (first inorganic insulating film) at an upper layer of the gate electrode GE and the scanning signal line GL, a capacitance electrode CE at an upper layer of the inorganic insulating film 18, an inorganic insulating film (second inorganic insulating film) 20 at an upper layer of the capacitance electrode CE, and a flattening film 21 at an upper layer of a source electrode SE, a drain electrode DE, a data line DL and a high-level power supply line HL at an upper layer of the inorganic insulating film 20.

The semiconductor film 15 is formed of low-temperature polysilicon (LIPS) or an oxide semiconductor (e.g. In—Ga—Zn—O based semiconductor), for example. A thin film transistor (TFT) Tr is configured by including the semiconductor film 15, the gate electrode GE, the source electrode SE, and the drain electrode DE. FIG. 2 illustrates a transistor with a top gate structure, but a bottom gate structure may also be employed.

The gate electrode (first metal layer) GE, the scanning signal line GL, the light emission control line EM, the capacitance electrode (second metal layer) CE, the source electrode (third metal layer) SE, the drain electrode (third metal layer) DE, the data line DL, and the high-level power supply wiring line HL, are each formed of a single layer film or a layered film of metal including at least one of aluminum, tungsten, molybdenum, tantalum, chromium, titanium, and copper, for example.

The TFT layer 4 in FIG. 2 includes a single semiconductor layer and a three metal layers (a first electrode layer, a second electrode layer, and a third electrode layer).

The gate electrode (first metal layer) GE is a lower layer electrode included in a subpixel circuit. The capacitance electrode (second metal layer) CE is an electrode at an upper layer of the gate electrode GE, among electrodes included in the subpixel circuit. The source electrode (third metal layer) SE and the drain electrode (third metal layer) DE are electrodes at an upper layer of the capacitance electrode CE, among electrodes included in the subpixel circuit.

The gate electrode Ge and the scanning signal line GL are the first metal layer formed by the same process (in the same layer and with the same material).

The metal layer in which the capacitance electrode CE is formed is the second metal layer formed by a process that is the same as that for the capacitance electrode CE (in the same layer and with the same material).

The source electrode SE, the drain electrode DE, the data line DL, and the high-level power supply line HL are the third metal layer formed by the same process (in the same layer and with the same material).

Note that the high-level power supply lines HL may be provided in the column and row directions on the display area DA in an intersecting manner, and may be coupled outside the display area DA through contact holes formed in the inorganic insulating films 18 and 20. In this case, for example, the high-level power supply line HL extending in the column direction (or the row direction) may be formed in the third metal layer, and the high-level power supply line HL extending in the row direction (or the column direction) may be formed by the second metal layer (with the same material and in the same metal layer as the capacitance electrode CE).

Each of the inorganic insulating films 16, 18, and 20 can be formed of, for example, a silicon oxide (SiOx) film or a silicon nitride (SiNx) film, or a layered film of these, formed using CVD. The flattening film 21 can be formed of a coatable organic material such as polyimide or acrylic, for example.

The light-emitting element layer 5 includes an anode (first electrode, anode electrode) 22 at an upper layer of the flattening film 21, an insulative edge cover 23 covering an edge of the anode 22, an electroluminescence (EL) layer 24 at an upper layer of the edge cover 23, and a cathode (second electrode, cathode electrode) 25 at an upper layer of the EL layer 24. The edge cover 23 is formed by applying an organic material such as a polyimide or an acrylic and then by patterning through photolithography, for example.

For each subpixel SP, a light-emitting element ES (for example, organic light-emitting diode (OLED) or quantum dot light-emitting diode (QLED)) including an island shaped anode 22 and an EL layer 24, and a cathode 25 that is a common layer extending across the subpixels SP is formed in the light-emitting element layer 5 and a subpixel circuit (described later) that controls the light-emitting element ES is formed in the TFT layer 4.

For example, the EL layers 24 are formed by layering a hole injection layer, a hole transport layer, a light-emitting layer, an electron transport layer, and an electron injection layer in this order, from the lower layer side. The light-emitting layer is formed into an island shape in an opening of the edge cover 23 (on a subpixel-by-subpixel basis) by vapor deposition or an ink-jet method. Other layers are formed in an island shape or a solid-like shape (common layer). A configuration is also possible in which one or more layers are not formed, out of the hole injection layer, the hole transport layer, the electron transport layer, and the electron injection layer.

When the light-emitting layer of the OLED is formed by vapor deposition, a fine metal mask (FMM) is used. The FMM is a sheet (for example, made of an invar material) including multiple openings, and an island shaped light-emitting layer (corresponding to one subpixel SP) is formed by an organic material passing through one opening.

The light-emitting layer of the QLED can, for example, be formed as an island shaped light-emitting layer (corresponding to one subpixel SP) by applying a solvent having quantum dots diffused by the inkjet method.

The anodes 22 are formed by layering of Indium Tin Oxide (ITO) and silver (Ag) or alloy containing Ag, for example, and have light reflectivity. The cathode (cathode electrode) 25 can be constituted by a transparent conductive material such as an MgAg alloy (extremely thin film), ITO, or Indium zinc Oxide (ILO).

In a case where the light-emitting element ES is an OLED, positive holes and electrons are recombined inside the light-emitting layer by a drive current between the corresponding anode 22 and the cathode 25, and light is emitted in a process where excitons that are generated by the recombination transition to a ground state. Since the cathode 25 is transparent and the anode 22 has light reflectivity, the light emitted from the EL layer 24 travels upward and becomes top-emitting.

In a case where the light-emitting element ES is a QLED, positive holes and electrons are recombined inside the light-emitting layer by a drive current between the corresponding anode 22 and the cathode 25, and light (fluorescence) is emitted in a process where excitons that are generated by the recombination transition from the conduction band to the valence band of quantum dots.

A light-emitting element (such as an inorganic light-emitting diode) other than the OLED or QLED may be formed in the light-emitting element layer 5.

Of the four sides of the display area DA, both sides parallel to the direction in which the scanning signal lines GL are arranged (i.e., a side parallel to the extension direction of the data line DE) are referred to as a first side DAa and a third side DAc. The upper side and the lower side in the drawing sheet of FIG. 2 are the first side DAa, and the third side DAc, respectively. Of the four sides of the display area DA, both sides parallel to the direction in which the data lines DL are arranged (i.e., a side parallel to the extension direction of the scanning signal line GL) are referred to as a second side DAc and a fourth side DAd. The right side and the left side in the drawing sheet of FIG. 2 are the second side DAb, and the fourth side DAd, respectively. The second side DAb is one of both sides of the display area DA opposite to each other, closer to the terminal portion TS, and the fourth side DAd is one of both sides of the display area DA opposite to each other, farther from the terminal portion TS.

In the non-display area NA, a first frame-shaped bank Ta and a second frame-shaped bank Tb that define the edge of an organic buffer film 27 are formed. The first frame-shaped bank Ta and the second frame-shaped bank Tb each surround the entire circumference of the display area DA. The first frame-shaped bank Ta functions as a liquid stopper when the organic buffer film 27 is applied by the ink-jet method. The second frame-shaped bank Tb surrounds the outside of the first frame-shaped bank Ta, and functions as a backup liquid stopper. The lower portion of the second frame-shaped bank Tb is formed by the flattening film 21. An upper portion 23b of the second frame-shaped bank Tb and the first frame-shaped bank Ta are in the same layer as that of the edge cover 23, and can be formed by the same process and the same material as the edge cover 23.

The sealing layer 6 is transparent, and includes an inorganic sealing film 26 covering the cathode 25, the organic buffer film 27 at an upper layer of the inorganic sealing film 26, and an inorganic sealing film 28 at an upper layer of the organic buffer film 27. The sealing layer 6 covering the light-emitting element layer 5 inhibits foreign matter, such as water and oxygen, from penetrating to the light-emitting element layer 5.

The inorganic sealing film 26 and the inorganic sealing film 28 are each an inorganic insulating film, and can be formed of, for example, a silicon oxide film, a silicon nitride film, or a silicon oxynitride film, or a layered film of these, formed by CVD. The organic buffer film 27 is a transparent organic film having a flattening effect and can be formed of a coatable organic material such as acrylic. While the organic buffer film 27 can be formed, for example, through application by the inkjet method, a bank for stopping liquid droplets may be provided in the non-display area NA.

The lower face film 10 is a film bonded on the lower face of the resin layer 12 after the support substrate is peeled off, for achieving a display device with excellent flexibility, and is a PET film for example. The function film 39 has at least one of an optical compensation function, a touch sensor function, a protection function, for example.

In an electronic circuit board mounted on the terminal portion TS extending along one side of the display device 2, a high-level power supply that generates high-level power supply voltage (ELVDD), a low-level power supply that generates low-level power supply voltage (ELVSS), a data driver that controls driving of the data line DL, and the like are formed. The electronic circuit board is provided extending along one of the sides defining the outer shape of the display device 2 in the non-display area NA. The terminal portion TS transmits various signals input from various circuits of the electronic circuit board to the lead wiring line TW coupled to the terminal portion TS. Thus, the lead wiring line TW coupled to the terminal portion TS transmits various signals to the display area DA.

Scanning drivers SDR1 and SDR2 are provided in areas of the non-display area NA, opposite to the first side DAa and the third side DAc of the display area DA. The scanning drivers SDR1 and SDR2 control the driving of the scanning signal line GL and the light emission control line EM.

In the above, the flexible display device is described, but in the case of manufacturing a non-flexible display device, generally, the resin layer needs not to be formed and the substrate does not need to be replaced, and thus the process proceeds to step S9 after steps S2 to S5 for layering on the glass substrate are performed for example.

Subpixel Circuit Configuration

Figure 7:
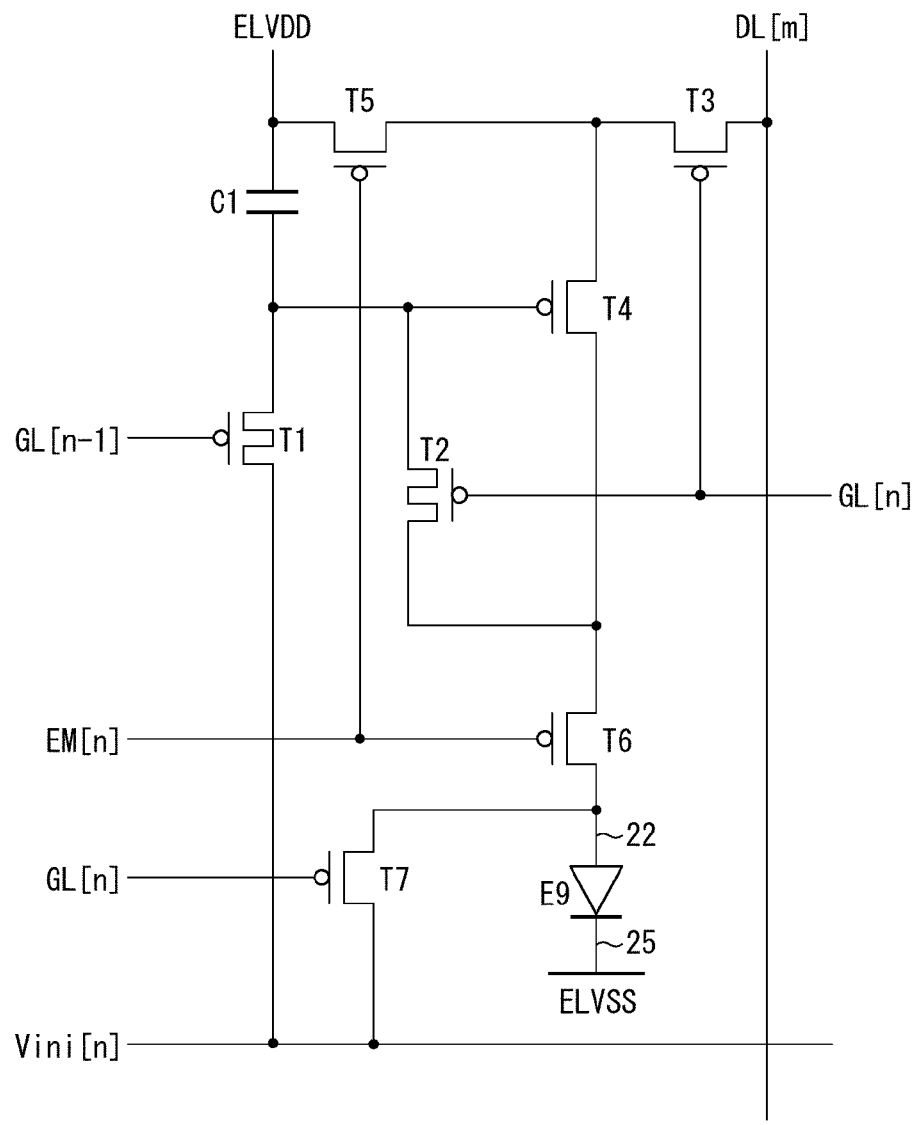
FIG. 7 is a diagram illustrating a configuration of a subpixel circuit disposed in a display area of the display device of the first embodiment.

FIG. 7 is a diagram illustrating a configuration of a subpixel circuit disposed in the display area DA. FIG. 7 illustrates a configuration of a subpixel circuit corresponding to the m-th column and the n-th row. Note that the configuration of the subpixel circuit described here is merely one example, and another configuration can be employed instead.

As illustrated in FIG. 2 and FIG. 7, the display area DA is provided with a data line DL[m] and a high-level power supply line ELVDD extending in the row direction as well as a scanning signal lines GL[n−1] and GL[n], a light emission control line EM[n], and an initialization power supply line Vini[n] extending in the column direction intersecting with the row direction. The light emission control line EM[n] is provided to be in one-to-one relationship with the scanning signal line GL[n].

The high-level power supply line ELVDD may be provided to be in one-to-one relationship with the data line DL[m], or may be provided for each set of a plurality of data lines DL[m]. High-level power supply voltage (ELVDD), which is common constant voltage for each of the subpixel circuits in the display area DA, is supplied through the high-level power supply line ELVDD.

A capacitor C1 is constituted by the capacitance electrode CE and the scanning signal line GL (FIG. 3), and accumulates the capacitance required for operation of the subpixel circuit in the portion where the capacitance electrode CE and the scanning signal line GL overlap. The capacitance electrode CE is coupled to the high-level power supply line ELVDD, and thus the high-level power supply voltage (ELVDD) is supplied thereto.

The low-level power supply voltage (ELVSS), which is common constant voltage for the subpixel circuits, is supplied to the cathode 25 of the light-emitting element ES.

As an example, the low-level power supply voltage (ELVSS), which is constant voltage, is approximately −4 V, the high-level power supply voltage (ELVDD), which is constant voltage, is approximately 5 V, the initialization power supply voltage (Vini), which is constant voltage, is approximately −5 V, the emission control voltage (EM) is approximately −8 V in an active state (ON state) and is approximately 7 V in a non-active state (OFF state), scanning signal voltage (scan) is approximately −8 V in the active state (ON state) and is approximately 7 V in the non-active state (OFF state), and data signal voltage (data) is approximately 6 V in the active state (black display state) and is approximately 3 V in the non-active state (white display state).

In one example illustrated in FIG. 7, the subpixel circuit includes an initialization transistor T1, a threshold voltage compensation transistor T2, a write control transistor T3, a drive transistor T4, a power supply control transistor T5, a light emission control transistor T6, and an anode electrode charge discharge transistor T7 formed in the TFT layer 4. The write control transistor T3 is coupled to the scanning signal line GL[n] and the data line DL[m].

A potential signal corresponding to a display gray scale is supplied to the subpixel SP from the data line DL[m] in a period during which the scanning signal line GL[n] is active, and the light-emitting element ES emits light with luminance corresponding to the display gray scale data in a period during which the light emission control line EM[n] is active.

Specific Configuration of Non-Display Area NA

As illustrated in FIGS. 2 to 6, the non-display area NA is provided with a plurality of lead wiring lines TW configured to supply various voltages from the electronic circuit hoard to the display area DA via the terminal portion TS. The lead wiring lines TW have one end portions coupled to each of the circuits of the electronic circuit board by interposing the terminal portion TS, extend in the display area DA direction, and have the other end portions coupled to various wiring lines and the like.

The lead wiring line TW is a wiring line including a wiring line TWG of the first metal layer formed of first metal layer.

The lead wiring lines TW have one end portions coupled to the terminal portion TS, and thus the lead wiring lines TW is coupled to each of the circuits of the electronic circuit board by interposing the terminal portion TS, extend in the display area DA direction toward the other end portions, and have the other end portions coupled to various wiring lines and the like.

For example, the lead wiring line TW includes the first wiring line TWS and the wiring line TWG of the first metal layer. The first wiring line TWS is a wiring line that is formed in the same layer as that of the data line DL, is formed on the inorganic insulating film 20, and extends from the potential circuit board CB to a position immediately before the bending portion CL. Note that the first wiring line TWS may be provided on the inorganic insulating film 20 closer to the display area DA than the bending portion CL.

The wiring line TWG of the first metal layer is a wiring line that is formed in the same layer as that of the gate electrode GE, is formed on the inorganic insulating film 16, has one end portion coupled to the first wiring line TWS through the contact holes formed in the inorganic insulating films 18 and 20, passes through the lower layer of the bending portion CL intersecting with the bending portion CL, and has the other end portion coupled with various wiring lines through the contact holes. Note that the wiring line TWG of the first metal layer may be provided on the inorganic insulating film 16 closer to the display area DA than the bending portion CL.

The example illustrated in FIG. 4 depicting the lead wiring line TWD of the lead wiring lines TW, which has one end portion coupled to the data driver by interposing the terminal portion TS and the other end portion coupled to the data line DE. The lead wiring line TWD supplies the data signal voltage supplied from the data driver to the data line DE.

The example illustrated in FIG. 5 depicting the lead wiring line TWL of the lead wiring lines TW, which has one end portion coupled to the low-level power supply by interposing the terminal portion TS and the other end portion coupled to the third conductive layer SM. As described later, the lead wiring line TWL supplies the low-level power supply voltage (ELVSS) supplied from the low-level power source to the cathode 25 via the third conductive layer SM.

The example illustrated in FIG. 6 depicting, the lead wiring line TWH of the lead wiring lines TW, which includes one end portion coupled to the high-level power supply by interposing the terminal portion TS and the other end portion coupled to the second conductive layer CM1. As described later, the lead wiring line TWH supplies the high-level power supply voltage (ELVDD) supplied from the high-level power source to the second conductive layer CM1.

The lead wiring lines TW may further include, for example, a lead wiring line having one end coupled to the high-level power supply of the electronic circuit board by interposing the terminal portion TS and the other end portion coupled to the high-level power supply line to supply the high-level power supply voltage (ELVDD) to the high-level power supply line HL.

As illustrated in FIGS. 2 to 6, in the non-display area NA, a first slit (slit) H1 and a second slit (slit) H2 are formed in the flattening film 21 so as to surround at least a portion of the outer circumference of the display area DA.

The first slit H1 and the second slit H2 are grooves formed in the flattening film 21. The first slit (slit) H1 is a region between the flattening film 21 and the second frame-shaped bank Tb, and surrounds the outer circumference of the display area DA.

The second slit H2 is provided on the inner circumferential side of the first slit H1. The second slit H2 surrounds three sides of the outer circumference of the display area DA (e.g., the first side DAa, the third side DAc, and the fourth side DAd), and both end portions thereof are separated from each other. Both end portions of the second slit H2 are separated from each other in the area between the second side DAb of the display area DA and the terminal portion TS. In other words, a gap of the second slit H2 is provided in the area between the second side DAb of the display area DA and the terminal portion TS.

Note that the first frame-shaped bank Ta may be formed by the flattening film 21 instead of being formed by the same process as the edge cover 23. In this case, a plurality of the first slits H1 are formed, including a slit between the flattening film 21 and the first frame-shaped bank Ta, and a slit between the second frame-shaped bank Ta and the second frame-shaped bank Tb.

The cathode 25 covering the display area DA expands into the non-display area NA, and thus cathode 25 is further formed in the second slit H2. Note that the cathode 25 is further formed in the non-display area NA without having the edge overlapping with the first frame-shaped bank Ta.

In the non-display area NA, a first conductive layer 22M which is in the same layer as that of the anode 22 and is separated from the anode 22 is formed on the flattening film 21. The first conductive layer 22M is provided across both the first slit H1 and the second slit H2 connecting the first and second slits H2 with each other, and is also provided on the bottom surfaces and the side surfaces of each of the first and second slits H1 and H2.

The first conductive layer 22M surrounds three sides of the outer circumference of the display area DA (e.g., the first side DAa, the third side DAc, and the fourth side DAd), and both end portions thereof are separated from each other. The first conductive layer 22M has both end portions separated from each other in an area between the second side DAb of the display area. DA and the electronic circuit board CB on which the source driver is disposed. In other words, a gap of the first conductive layer 22M is provided in the area between the second side DAb of the display area DA and by interposing the terminal portion TS.

The third conductive layer SM is provided to overlap with at least a part of the first slit H1. The third conductive layer SM is in the same layer as those of the source electrode SE and the drain electrode DE and is separated from the source electrode SE and the drain electrode DE.

The third conductive layer SM surrounds three sides of the outer circumference of the display area DA (e.g., the first side DAa, the third side DAc, and the fourth side DAd), and both end portions thereof are separated from each other. The third conductive layer SM has both end portions separated from each other in an area between the second side DAb of the display area DA and the electronic circuit board CB on which the source driver is disposed. Thus, a gap of the third conductive layer SM is provided in an area between the second side DAb of the display area DA and the electronic circuit board CB on which the source driver is disposed.

The first conductive layer 22M overlaps with the third conductive layer SM at the lower layer in the first slit H1, being electrically coupled thereto. The first conductive layer 22M overlaps with the cathode 25 at the upper layer in the second slit H2, being electrically coupled thereto. Furthermore, the first conductive layer 22M is electrically coupled to the lead wiring line TWL of the lead wiring lines TW, which has one end coupled to the low-level power supply provided to the electronic circuit board CB, through the contact hole (FIG. 5).

In other words, in at least one of the first and second slits H1 and H2, the first conductive layer 22M, which is in the same layer as that of the first electrode and is separated from the first electrode, has the lower face being in contact with the inorganic insulating film 20 or the third conductive layer SM. In at least one of the first and second slits H1 and H2, the first conductive layer 22M and the second conductive layer CM1 or the second conductive layer CM2 overlap by interposing the inorganic insulating film 20. Furthermore, the plurality of lead wiring lines TW, including the wiring line TWG formed of the first metal layer and electrically coupled with the wiring line of the display area DA, overlap with the second conductive layer second conductive layer CM1 or the second conductive layer CM2 by interposing the inorganic insulating film 18 in at least one of the first and second slits H1 and H2.

Thus, the low-level power supply voltage (ELVSS) supplied from the low-level power supply is supplied to the third conductive layer SM through the lead wiring line TWL, is supplied from the third conductive layer SM to the first conductive layer 22M in the first slit H1, and is supplied from the first conductive layer 22M to the cathode 25 in the second slit H2. Thus, the low-level power supply voltage (ELVSS) required for light emission of the light-emitting element ES can be supplied to each subpixel circuit in the display area DA.

The first conductive layer 22M is in contact with the third conductive layer SM in the first slit H1 and is in contact with the cathode 25 in the second slit H2 with surrounding three sides (e.g., the first side DAa, the third side DAc, and the fourth side DAd) of the outer circumference of the display area DA. Thus, the low-level power supply voltage (ELVSS) that is constant voltage can be uniformly supplied in the plane of the display area DA.

Here, a variety of voltages (such as, for example, high-level power supply voltage and data signal voltage) are applied to the lead wiring lines TW provided in the non-display area NA in addition to the low-level power supply voltage (ELVSS).

In the area in the non-display area NA where the flattening film 21 is formed, the first conductive layer 22M is formed on the flattening film 21 having a relatively thick film thickness. Thus, even when the lead wiring line TW intersects with the first conductive layer 22M in the lower layer of the flattening film 21, the mutual influence of the capacity load (that is, effect of noise therebetween) is limited.

However, in the first slit where the first conductive layer 22M is in contact with the third conductive layer SM and in the second slit H2 where the first conductive layer 22M is in contact with the cathode 25, the first conductive layer 22M is provided on the bottom surface of each of the first and second slits H1 and H2. Thus, in the first slit H1 and the second slit H2, the distance between the first conductive layer 22M and the layer in which the lead wiring line TW is formed (specifically, the layer in which the wiring line TWG of the first metal layer is formed) is short.

For this reason, in related art, it is not preferable to provide a lead wiring line to intersect with the first slit and the second slit, and the lead wiring line need to be led not to intersect with the first slit or the second slit as much as possible.

In view of this, as illustrated in FIGS. 2 to 5, in the display device 2, the second conductive layer CM1, in the same layer as that of the capacitance electrode CE, is further provided overlapping with the first slit H1 by interposing the inorganic insulating film 20. The second conductive layer CM2 in the same layer as that of the capacitance electrode CE is further provided overlapping with the second slit H2 by interposing the inorganic insulating film 20.

Specifically, the second conductive layer CM1 is interposed between the first conductive layer 22M provided in the first slit H1 and the lead wiring line TW provided in the lower layer of the first slit H1. The second conductive layer CM2 is interposed between the first conductive layer 22M provided in the second slit H2 and the lead wiring line TW provided in the lower layer of the second slit H2.

Thus, even when the lead wiring line TW is provided to at least partially overlap with each of the first and second slits H1 and H2, the second conductive layers CM1 and CM2 can block the mutual influence of capacity load due to the difference in the voltage (the low-level power supply voltage (ELVSS), for example) of the first conductive layer 22M provided in each of the first slit H1 and the second slit H2 and the voltage of the lead wiring line TW (the high-level power supply voltage (ELVDD), the data signal voltage, or the like, for example). Thus, the display device 2 can have the lead wiring line TW provided to intersect with the first slit H1 and the second slit H2. Thus, the display device 2 features an increased degree of freedom in the designing of the lead wiring line TW and can display high-quality image with no influence of noise.

As described above, the lead wiring line TW has one end portion coupled to the terminal portion TS and includes the wiring line TWG of the first metal layer, and thus can intersect with any one of the first slit H1 and the second slit H2 or both. Thus, the display device 2 features a high degree of freedom in terms of designing of wiring lines.

When a length in a direction away from the display area DA is defined as a width, the width of the third conductive layer SM is wider than the width of the first slit H1 and is narrower than the width of the second conductive layer CM1.

In the display device 2, the scanning drivers SDR1 and SDR2 are provided in areas in the non-display area NA adjacent to the display area DA. The scanning drivers SDR1 and SDR2 are provided between the display area DA and the first slit H1. The scanning driver SDR1 is provided to extend along the first side DAa of the display area DA, and the scanning driver SDR2 is provided to extend along the third side DAc of the display area DA.

Thus, a plurality of scanning signal lines GL and the plurality of light emission control lines EM are coupled to each of the scanning drivers SDR1 and SDR2. In the display device 2, the scanning drivers SDR1 and SDR2 control the driving of the plurality of scanning signal lines GL and the plurality of light emission control lines EM provided in the display area DA from both sides (the first side DAa side and the third side DAc side) of the display area DA.

The scanning drivers SDR1 and SDR2 are each provided across the second slit H2. In other words, each of the scanning drivers SDR1 and SDR2 is provided to overlap with the second slit H2.

As illustrated in FIGS. 3 and 5, the scanning drivers SDR1 and SDR2 include a first driver transistor DRTr1 and a plurality of second driver transistors DRTr2 formed by the same manufacturing process as the thin film transistor Tr included in the TFT layer 4. The first driver transistor DRTr1 and the second driver transistor DRTr2 each include the semiconductor film 15, the gate electrode GE, the source electrode SE, and the drain electrode DE.

The first driver transistors DRTr1 are arranged along the extension direction of the second slit H2 and on the outer side of the second slit H2 which is the side farther from the display area DA. The second driver transistors DRTr2 are arranged along the extension direction of the second slit H2 and on the inner side of the second slit H2 which is the side closer to the display area DA.

Furthermore, the scanning drivers SDR1 and SDR2 further includes a driver wiring line DRW that is in the same layer as that of the gate electrode GE and is separated from the gate electrode GE.

The driver wiring line DRW is a lower layer of the second slit H2 and extends intersecting with the second slit H2 and the second conductive layer CM2. The driver wiring line DRW has one end portion coupled to the drain electrode DE of the first driver transistor DRTr1 through the contact holes provided in the inorganic insulating films 18 and 20, and has the other end portion coupled to the source electrode SE of the second driver transistor DRTr2 through the contact holes provided in the inorganic insulating films 18 and 20.

By thus providing the second conductive layer CM2 at the lower layer of the second slit H2, even when the low-level power supply voltage (ELVSS) is applied to the first conductive layer 22M provided in the second slit H2 for example, the first driver transistor DRTr1 and the second driver transistor DRTr2 can be electrically coupled to each other by interposing the driver wiring line DRW and be driven, with no noise provided to or received from the voltage of the first conductive layer 22M.

Note that the scanning drivers SDR1 and SDR2 are described as drivers controlling the driving of each of the plurality of scanning signal lines GL and the plurality of light emission control lines EM, may also be drivers that controls driving of only one of the plurality of scanning signal lines GL and the plurality of light emission control lines EM. Furthermore, only one of the scanning driver SDR1 and the scanning driver SDR2 may be provided.

In the above description, an example where the lead wiring line TW and the driver wiring line DRW overlap with the first conductive layer 22M to which the low-level power supply voltage (ELVSS) is supplied. Alternatively, the lead wiring line TW and the driver wiring line DRW may overlap with the member to which other constant voltage (such as the high-level power supply voltage (ELVDD) or the initialization power supply voltage (Vini), for example) is supplied.

Additionally, to the second conductive layers CM1 and CM2, the high-level power supply voltage (ELVDD) may be supplied. In this case, the second conductive layers CM1 and CM2 are electrically coupled to the lead wiring line TWH of the lead wiring lines TW, which has one end coupled to the high-level power supply by interposing the terminal portion TS, through the contact hole provided in the inorganic insulating film 20 (FIG. 6). Note that FIG. 6 illustrates an example in which the second conductive layer CM1 is coupled to the lead wiring line TWH. The second conductive layer CM2 is similarly coupled to the lead wiring line TWH.

Alternatively, the high-level power supply line HL in the display area DA extends into the non-display area NA from the display area DA across the fourth side DAd of the display area DA, overlapping with the second conductive layers CM1 and CM2. With the second conductive layers CM1 and CM2 coupled to the high-level power supply line HL extending into the non-display area NA coupled to each other through the contact hole provided in the inorganic insulating film 20, the high-level power supply voltage (ELVDD) may be supplied to the second conductive layers CM1 and CM2.

Then, for example, the lead wiring line TW to which the data signal voltage is applied (i.e., the lead wiring line TW coupled to the data driver) intersects with the second conductive layers CM1 and CM2 coupled to the lead wiring line TWH.

An example of this data signal voltage is approximately 3 V (for example, when the light-emitting element emits white light) to 6 V (for example, the light-emitting element emits black light), and an example of the high-level power supply voltage is approximately 5 V. Thus, the data signal voltage and the high-level power supply voltage are relatively close. Therefore, effects of noise between the second conductive layers CM1 and CM2 and the lead wiring line TW that intersect with the second conductive layers CM1 and CM2 can be more reliably suppressed.

Note that other constant voltages (such as, for example, high-level power supply voltage (ELVDD), or initialization power supply voltage (Vini)) may be supplied to the second conductive layers CM1 and CM2. Furthermore, the second conductive layers CM1 and CM2 may be in an electrically floating state with no voltage supplied thereto.

The second conductive layer CM2 surrounds three sides of the display area DA. Thus, in a case where the high-level power supply voltage is supplied to the second conductive layer CM2, the end portion (end portion on the side far from the terminal portion TS) near the fourth side DAd of the high-level power supply line ELVDD provided in the display area DA may extend from the display area DA to the non-display area NA, and may be coupled to the second conductive layer CM2. Thus, more uniform constant voltage can be achieved for the high-level power supply line ELVDD in the display area DA. As a result, the display device 2 that can display image with higher quality can be obtained.

The plurality of data lines DL provided in the display area DA may include a data line DL having one of both end portions on the side closer to the terminal portion TS coupled to the lead wiring line TWD that is the lead wiring line TW coupled to the data driver, and a data line DL having one of both end portions on the side farther from the terminal portion TS coupled to the lead wiring line TWD that is the lead wiring line TW coupled to the data driver. Thus, the data signal voltage can be supplied to the plurality of data lines DL provided in the display area DA from both.

Note that the lead wiring line TWD coupled to one of both end portions of the data line DL on the side farther from the terminal portion TS may be a wiring line branched off from an intermediate part of the lead wiring line TWD coupled to one of both end portions of the data line DL on the side closer to the terminal portion TS, or may be a wiring line coupled to the data driver.

As described above, the display device 2 is provided with the second conductive layers CM1 and CM2, and thus a degree of freedom in design of the lead wiring line TW is high, whereby the wiring line can be led from the data driver to an end portion of the data signal line DL positioned in an area far from the data driver.

Note that the data DL may, with only one of both end portions on the side closer to the terminal portion TS coupled to the lead wiring line TWD, receive the data signal voltage from one side only.

Second Embodiment

Figure 8:
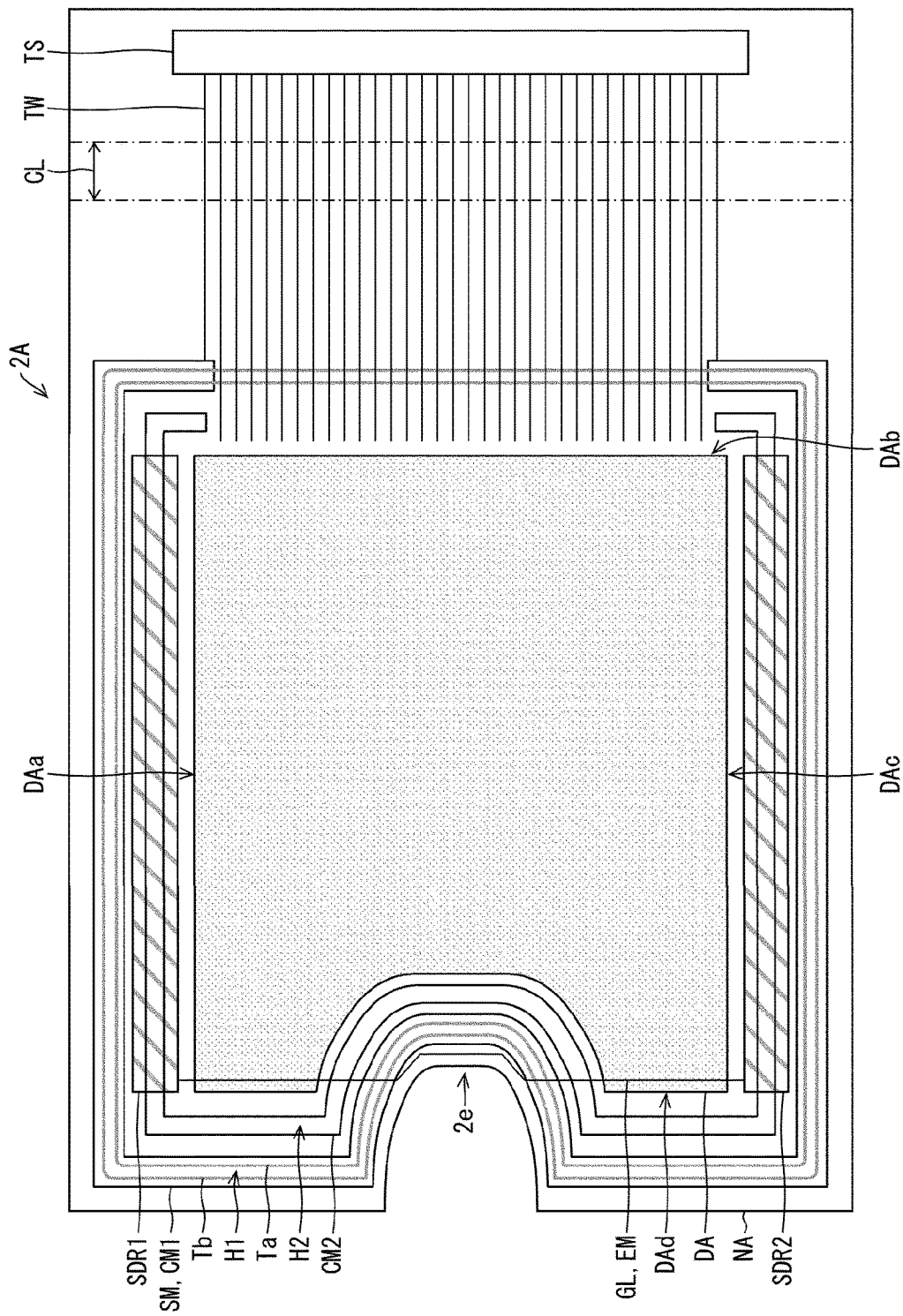
FIG. 8 is a plan view of the display device of a second embodiment.

In a case where a deformed portion is formed in the display area, a wiring line may be led along this deformed portion. FIG. 8 is a plan view illustrating a configuration of a display device 2A according to a second embodiment.

The display device 2A includes a deformed portion 2e on the third side DAc of the display area DA. The deformed portion 2e has a shape (notched shape) that is recessed in a direction toward the center of the display area DA from the third side DAc. Furthermore, the contour of the display device 2 is deformed along the deformed portion 2e on the third side DAc (a shape that is recessed in the direction toward the center). Furthermore, the first slit H1 and the second slit H2, between the third side DAc and the contour of the display device 2, also have deformed shape along the deformed portion 2e on the third side DAc.

Furthermore, the second conductive layers CM1 and CM2 also have deformed shapes corresponding to the deformed shapes of the first and the second slits H1 and H2 in the deformed portion of the first and the second slits H1 and H2.

Some of the plurality of scanning signal lines GL and the plurality of light emission control lines EM provided in the display area DA have a curved shape corresponding to the deformed portion 2e of the display area DA at outside the display area DA and in the deformed portion 2e of the display area DA.

Some of the scanning signal line GL and the plurality of light emission control lines EM described above extend from the scanning driver SDR1 or the scanning driver SDR2 into the display area DA, and extend out of the display area DA in the deformed portion 2e of the display area DA, pass through the lower layer of the second slit H2 intersecting with the second slit H2 and the second conductive layer CM2, pass through the lower layer of the first slit H1 intersecting with the first slit H1 and the second conductive layer CM1, and are curved toward the center of the display area DA along the deformed portion of the first slit H1. Furthermore, some of the scanning signal lines GL and the plurality of light emission control lines EM again pass through the lower layer of the first slit H1 intersecting with the first slit H1 and the second conductive layer CM1, pass through the lower layer of the second slit H2 intersecting with the second slit H2 and the second conductive layer CM2, extend into the display area DA in the deformed portion 2e of the display area DA, and extend in a direction of the scanning driver SDR2 or the scanning driver SDR1.

As described above, in the display device 2A, the second conductive layer CM1 is provided overlapping with the first slit H1, and the second conductive layer CM2 is provided overlapping with the second slit H2. Thus, the first slit H1 and the second slit H2 can intersect with the scanning signal line GL and the light emission control line EM. Thus, the supplied voltage can be prevented from being ununiform due to the deformed portion 2e, in the area of the display area DA provided by interposing the deformed portion 2e. Thus, the display device 2A that can display image with uniform brightness even when the deformed portion 2e is provided can be obtained.

Third Embodiment

Demultiplexers may be provided along two sides of the display area.

Figure 9:
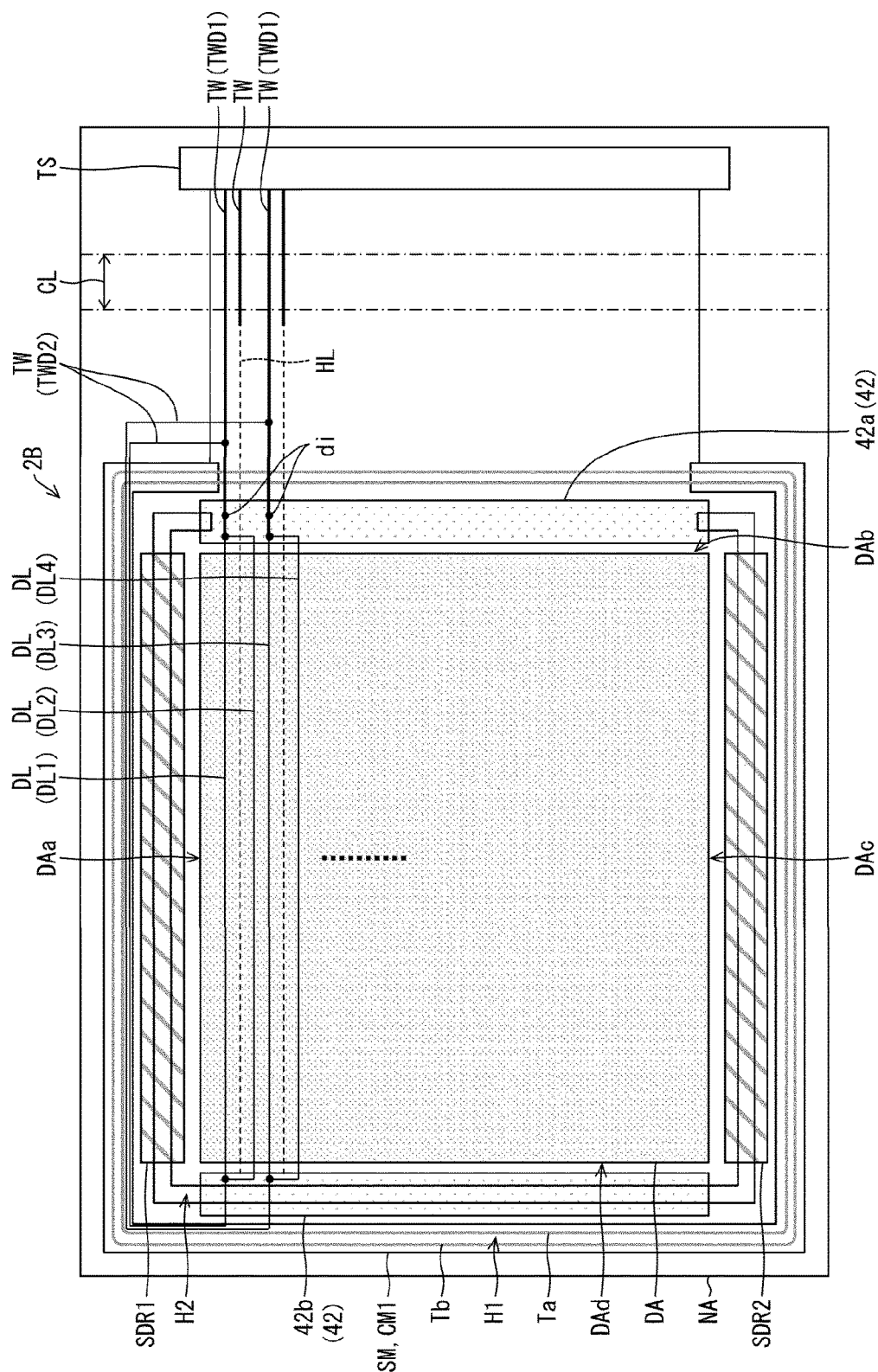
FIG. 9 is a plan view illustrating a configuration of a display device according to a third embodiment.

FIG. 9 is a plan view illustrating a configuration of a display device 2B according to a third embodiment.

In the display device 2B, selection output circuits 42a and 42b are provided in the non-display area NA. The selection output circuit 42a is provided extending along the second side DAb of the display area DA. The selection output circuit 42b is provided extending along the fourth side DAd of the display area DA.

Note that the selection output circuits 42a and 42b include the same circuit. The selection output circuits 42a and 42b will be collectively referred to as a selection output circuit 42, when they are not distinguished from each other.

Figure 10:
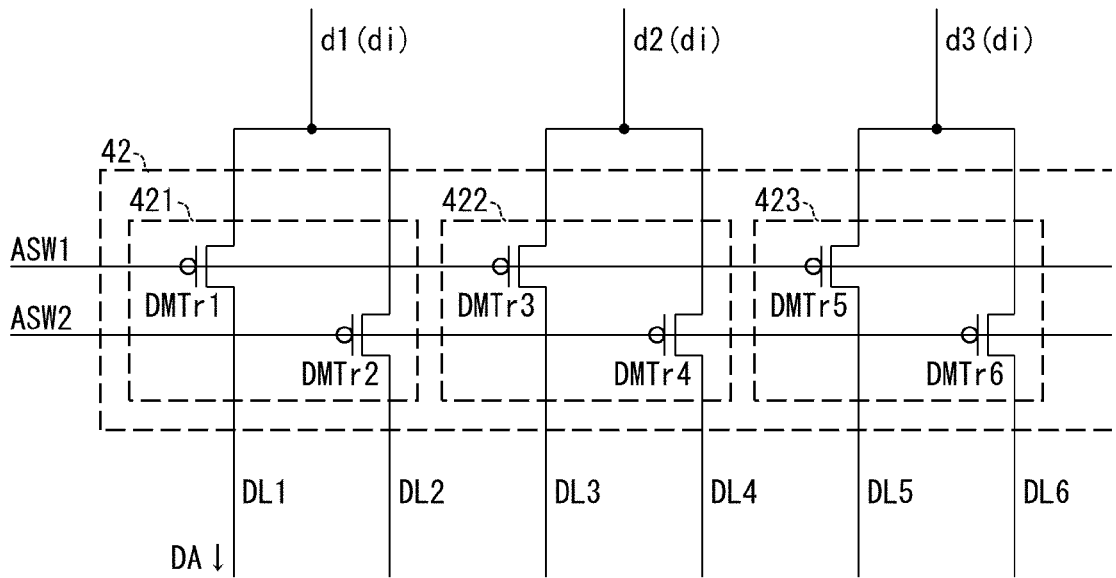
FIG. 10 is a diagram illustrating an example of a configuration of a selection output circuit in the display device according to the third embodiment.

FIG. 10 is a diagram illustrating an example of a configuration of the selection output circuit 42. The selection output circuit 42 includes a plurality of demultiplexers 421, 422, 423, . . . . Each of the demultiplexers 421, 422, 423, . . . is configured to combine the plurality of data signal lines DL provided in the display area DA into one data signal trunk line di.

In the example illustrated in FIG. 10, the demultiplexers 421, 422, 423, . . . combine two adjacent data signal lines DL into one data signal trunk line di (into each of RG, BR, and GB lines, and the like).

The demultiplexer 421 includes data signal lines DL1 and DL2 that branch off from a data signal trunk line d1 (di), a demultiplexer transistor DMTr1 provided on the data signal line DL1, and a demultiplexer transistor DMTr2 provided on the data signal line DL2. The demultiplexer 422 includes data signal lines DL3 and DL4 that branch off from a data signal trunk line d2 (di), a demultiplexer transistor DMTr3 provided on the data signal line DL3, and a demultiplexer transistor DMTr4 provided on the data signal line DL4. The demultiplexer 423 includes data signal lines DL5 and DL6 that branch off from a data signal trunk line d3 (di), a demultiplexer transistor DMTr5 provided on the data signal line DL5, and a demultiplexer transistor DMTr6 provided on the data signal line DL6. The same applied to other demultiplexers.

A control signal line ASW1 is commonly coupled to the demultiplexer transistors DMTr1, DMTr3, DMTr5, . . . that are each provided to one of the data signal lines. A control signal line ASW2 is commonly coupled to the demultiplexer transistors DMTr2, DMTr4, DMTr6, . . . that are each provided to the other one of the data signal lines.

With a control signal line (ASW) from the control signal lines ASW1 and ASW2, switching between ON and OFF of the demultiplexer transistors DMTr1, DMTr3, DMTr5, . . . and the demultiplexer transistors DMTr2, DMTr4, DMTr6, . . . is implemented. With the active state and the non-active state of the data signal lines DL1, DL3, DL5, . . . and the data signal lines DL2, DL4, DL6, . . . thus switched, switching between ON and OFF of the supply of the data signal voltage to each tight-emitting element from the data signal trunk line di is implemented.

Figure 11:
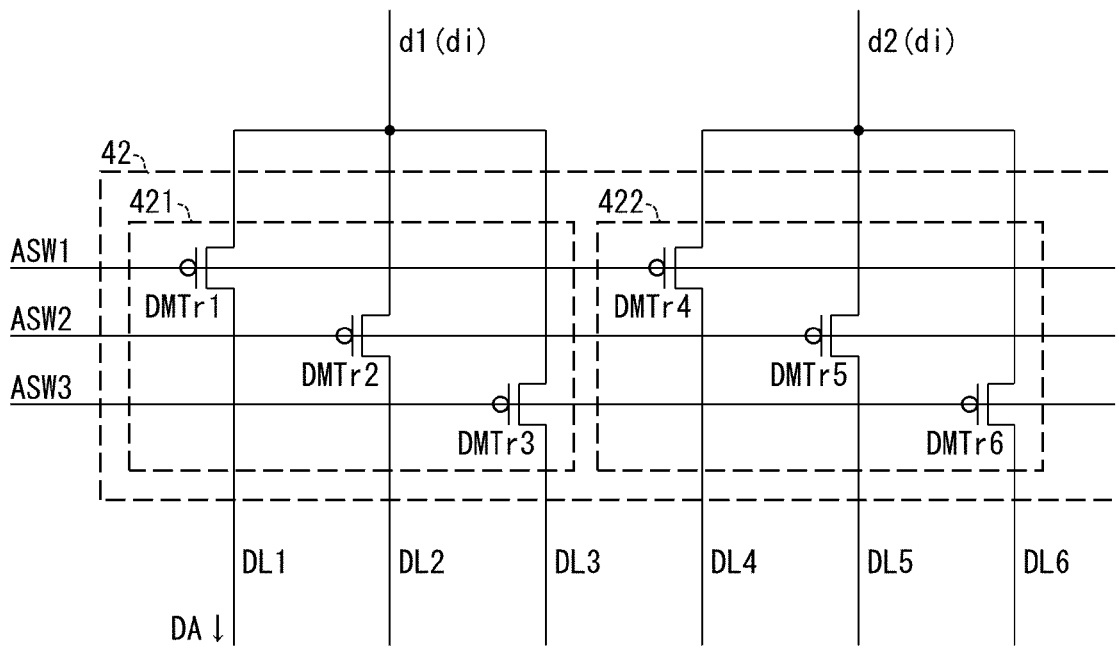
FIG. 11 is a diagram illustrating another example of a configuration of a selection output circuit in the display device according to the third embodiment.

Alternatively, the selection output circuit 42 may include a plurality of demultiplexers illustrated in FIG. 11. FIG. 11 is a diagram illustrating another example of a configuration of a selection output circuit in the display device according to the third embodiment.

In the example illustrated in FIG. 11, the demultiplexers 421, 422, . . . , combine three adjacent data signal lines DL into one data signal trunk line di for each RGB lines, and the like.

The demultiplexer 421 includes data signal lines DL1, DL2, and DL3 that branch off from a data signal trunk line d1 (di), a demultiplexer transistor DMTr1 provided on the data signal line DL1, a demultiplexer transistor DMTr2 provided on the data signal line DL2, and a demultiplexer transistor DMTr3 provided on the data signal line DL3. The demultiplexer 422 includes data signal lines DL4, DL5, and DL6 that branch off from a data signal trunk line d2 (di), a demultiplexer transistor DMTr4 provided on the data signal line DL4, a demultiplexer transistor DMTr5 provided on the data signal line DL5, and a demultiplexer transistor DMTr6 provided on the data signal line DL6. The same applied to other demultiplexers.

A control signal line ASW1 is commonly coupled to the demultiplexer transistors DMTr1, DMTr4, . . . that are respectively provided to the data signal lines DL1, DL4, . . . coupled to the light-emitting elements of the same color (red for example) among the data signal lines. A control signal line ASW2 is commonly coupled to the demultiplexer transistors DMTr2, DMTr5, . . . that are respectively provided to the data signal lines DL2, DL5, . . . coupled to the light-emitting elements of the same color (green for example) among the data signal lines. A control signal line ASW3 is commonly coupled to the demultiplexer transistors DMTr3, DMTr6, . . . that are respectively provided to the data signal lines DL3, DL6, . . . coupled to the light-emitting elements of the same color (blue for example) among the data signal lines.

With a control signal line (ASW) from the control signal lines ASW1, ASW2, and ASE3, switching between ON and OFF of the demultiplexer transistors DMTr1, DMTr4, . . . , the demultiplexer transistors DMTr2, DMTr5, . . . , and the demultiplexer transistors DMTr3, DMTr6, . . . is implemented. With the active state and the non-active state of the data signal lines DL1, DL4, . . . , the data signal lines DL2, DL5, . . . and the data signal lines DL3, DL6, . . . thus switched, switching between ON and OFF of the supply of the data signal voltage to each light-emitting element from the data signal trunk line di is implemented.

As illustrated in FIG. 9, in the display device 2B, the lead wiring line TW includes a first lead wiring line TWD1 configured to supply data signal voltage to the data signal trunk line di provided in the selection output circuit 42a, and a second lead wiring line TWD2 configured to supply data signal voltage to the data signal trunk line di provided in the selection output circuit 42b.

The first lead wiring line TWD1 has one end portion coupled to the data driver by interposing the terminal portion TS, and the other end portion electrically coupled to the data signal trunk line di provided in the selection output circuit 42a.

The second lead wiring line TWD2 intersects with at least one of the first and the second slits H1 and H2 and is electrically coupled to the data line DL in the display area DA.

The second lead wiring line TWD2 is branched off from the first lead wiring line TWD1 by being coupled to the first lead wiring line TWD1, extends in the non-display area NA along the first side DAa or the third side DAc of the display area DA, and has the other end portion electrically coupled to the data signal trunk line di provided to the selection output circuit 42a.

The first lead wiring line TWD1 and the second lead wiring line TWD2 are led by the first wiring line TWS and the wiring line TWG of the first metal layer.

With the display device 2B, the first lead wiring line TWD1 and the second lead wiring line TWD2 can be provided in the lower layer of at least one of the first and the second slits H1 and H2. Thus, even when the selection output circuit 42a is provided to face the first side DAa of the display area DA and the selection output circuit 42b is also provided to face the fourth side DAd of the display area DA, the first lead wiring line TWD1 and the second lead wiring line TWD2 can be provided with the effects of noise suppressed.

Fourth Embodiment

Figure 12:
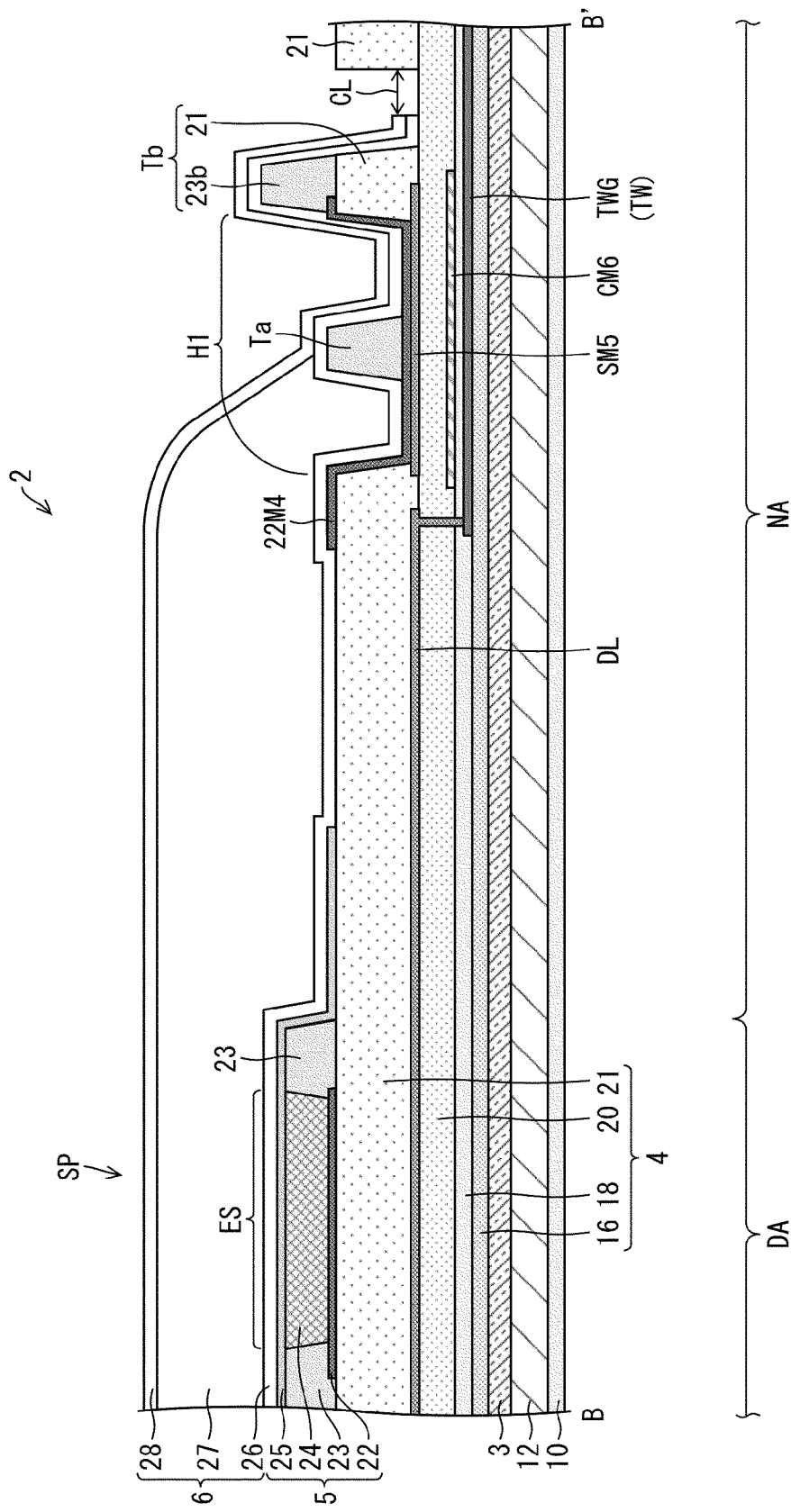
FIG. 12 is a cross-sectional view of a display device according to a fourth embodiment.

FIG. 12 is a cross-sectional view of a display device 2 according to a fourth embodiment.

The display device 2 of the present embodiment has a configuration in which, in the configuration of the display device 2 (FIG. 2) described in the first embodiment, a fourth conductive layer 22M4 (corresponding to the first conductive layer 22M of the first embodiment) that is formed in the same layer and with the same material as those of the first electrode 22 between both end portions of the third conductive layer SM in plan view, a fifth conductive layer SM5 (corresponding to the second conductive layer SM of the first embodiment) formed by the second metal layer, and a sixth conductive layer CM6 (corresponding to the third conductive layer CM1 of the first embodiment) formed by the third metal layer.

Specifically, the fourth conductive layer 22M4, the fifth conductive layer SM5, and the sixth conductive layer CM6 are provided between the display area DA and the terminal portion TS. The fourth conductive layer 22M4 is not coupled to the first conductive layer 22M, the fifth conductive layer SM5 is not coupled to the second conductive layer SM, and the sixth conductive layer CM6 is not coupled to the third conductive layer CM1.

The fourth conductive layer 22M4 is provided across the first slit H1 and is in contact with the sixth conductive layer CM6 exposed in the first slit H1.

The sixth conductive layer CM6 is separated from the third conductive layer SM, receives the high-level power supply voltage (constant voltage), and is electrically coupled to the high-level power supply line HL of the display area DA. In other words, at least one end portion of the high-level power supply line HL of the display area DA is coupled to the sixth conductive layer CM6. The sixth conductive layer CM6 functions as a trunk wiring line of the high-level power supply line HL of the display area DA.

The sixth conductive layer CM6 overlaps with the fifth conductive layer SM5 by interposing the inorganic insulating film 20. The fifth conductive layer SM5 receives constant voltage, for example, a high-level power supply voltage, with a little voltage difference from the data signal input to the data line DL. Still, even when the same high-level power supply voltage as the sixth conductive layer CM6 is input to the fifth conductive layer SM5, the fifth conductive layer SM5 is not electrically coupled to the high-level power supply line HL.

The lead wiring line TW that is electrically coupled to the data line DL overlaps by interposing the inorganic insulating film 18. As a specific example, the lead wiring line TW extends from the terminal portion TS, intersects with the first slit H1, the fourth conductive layer 22M4, the fifth conductive layer SM5, and the sixth conductive layer CM6 due to the wiring line TWG of the first metal layer, and is coupled to the data line DL through contact holes provided in the inorganic insulating films 18 and 20.

With such a configuration, fluctuations in the high-level power supply voltage of the sixth conductive layer CM6 due to the data signal of the data line DL is suppressed, and a high-quality image can be displayed with no effect of noise.

Other Displays

The display (display device) according to the first to third embodiments is not particularly limited, as long as the display is a display panel including a display element. The display element is a display element of which luminance and transmittance are controlled by an electric current, and examples of the electric current-controlled display element include an organic Electro Luminescence (EL) display provided with an Organic Light-Emitting Diode (OLED), an EL display such as an inorganic EL display provided with an inorganic light-emitting diode, and a QLED display provided with a Quantum Dot Light-Emitting Diode (QLED).

Supplement

A display device according to one aspect of the disclosure includes, a display area including a plurality of subpixels each including a subpixel circuit including a transistor and a non-display area located in periphery of the display area, where a subpixel is not formed. In the display area, a first metal layer including an electrode at a lower layer included in the subpixel circuit, a first inorganic insulating film formed at an upper layer of the first metal layer, a second metal layer formed at an upper layer of the first inorganic insulating film and including an electrode, of electrodes included in the subpixel circuit, at an upper layer of the first metal layer, a second inorganic insulating film formed at an upper layer of the second metal layer, a third metal layer formed at an upper layer of the second inorganic insulating film and including an electrode, of the electrodes included in the subpixel circuit, at an upper layer of the second metal layer, a flattening film formed at an upper layer of the third metal layer, and a light-emitting element formed at an upper layer of the flattening film and including a first electrode and a second electrode with a light-emitting layer interposed between the first electrode and the second electrode are formed, the first electrode is formed in an island shape for each of the plurality of subpixels, the second electrode is formed to extend across the plurality of subpixels. In the non-display area, a slit surrounding at least a part of an outer circumference of the display area is formed in the flattening film, in the slit, a lower face of a first conductive layer located in the same layer as a layer of the first electrode and separated from the first electrode is in contact with a third conductive layer formed by the third metal layer or the second inorganic insulating film, in the slit, the first conductive layer and a second conductive layer formed by the second metal layer overlap with the second inorganic insulating film interposed between the first conductive layer and the second conductive layer, the non-display area is further provided with a plurality of lead wiring lines including a wiring line formed by the first metal layer and electrically coupled to a wiring line in the display area, and in the slit, the plurality of lead wiring lines overlap with the second conductive layer with the first inorganic insulating film interposed between the plurality of lead wiring lines and the second conductive layer.

According to a display device of a second aspect of the disclosure, in the first aspect, the non-display area may be provided with a first frame-shaped bank entirely surrounding the outer circumference of the display area and a second frame-shaped bank entirely surrounding an outer side of the first frame-shaped bank, the slit may include a first slit, and the first slit may be provided between the flattening film and the second frame-shaped bank.

According to a display device of a third aspect of the disclosure, in the first or the second aspect, the first conductive layer may be in contact with the third conductive layer in the first slit.

According to a display device of a fourth aspect of the disclosure, in the second aspect, the display device may further include a sealing layer entirely covering the display area. The sealing layer may include a first inorganic layer, an organic layer formed at an upper layer of the first inorganic layer, and a second inorganic layer formed at an upper layer of the organic layer, and an edge of the organic layer may overlap with the first frame-shaped bank or the second frame-shaped bank.

According to a display device of a fifth aspect of the disclosure, in the second aspect, the slit may include a second slit, and the second slit may be provided on an inner circumferential side of the first slit and surround a part of the outer circumference of the display area, and both end portions of the second slit are separated from each other.

According to a display device of a sixth aspect of the disclosure, in the fifth aspect, the first conductive layer may extend across the first slit and the second slit, and extend along three sides of the outer circumference of the display area.

According to a display device of a seventh aspect of the disclosure, in the fifth or sixth aspect, a plurality of the second conductive layers may be formed at a lower layer of the first slit and the second slit and overlap with each of the first slit and the second slit.

According to a display device of an eighth aspect of the disclosure, in the fifth to seventh aspects, in the second slit, the first conductive layer and the second conductive layer, as well as the second electrode and the second conductive layer may be electrically coupled to each other by interposing the first conductive layer.

According to a display device of a ninth aspect of the disclosure, in the fifth to eighth aspects, the display area may be provided with a plurality of data signal lines configured to supply a data signal to the plurality of subpixels, a plurality of gate lines configured to scan the plurality of subpixels, and a plurality of light emission control lines, the plurality of gate lines and the plurality of light emission control lines intersecting with the plurality of data signal lines, and a scanning driver extending along one side of the display area and configured to control driving of at least one of the plurality of gate lines and the plurality of light emission control lines may be provided in the non-display area between the display area and the first slit.

According to a display device of a tenth aspect of the disclosure, in the ninth aspect, the scanning driver may be provided to extend across the second slit, and include a first driver transistor that is a transistor provided on an outer side of the second slit that is a side farther from the display area than the second slit and a second driver transistor that is a transistor provided on an inner side of the second slit that is a side closer to the display area than the second slit, and the first driver transistor and the second driver transistor may be coupled to each other through a driver wiring line that is a wiring line in the same layer as a layer of the plurality of lead wiring lines and intersects with the second slit.

According to a display device of an eleventh aspect of the disclosure, in the first to the tenth aspects, the non-display area may be provided with a selection output circuit including a plurality of demultiplexers configured to combine the plurality of data signal lines provided in the display area into one data signal trunk line, and the selection output circuit may be provided along a side of the display area extending in a direction intersecting with the plurality of data signal lines.

According to a display device of a twelfth aspect of the disclosure, in the eleventh aspect, the selection output circuit may include a first selection output circuit and a second selection output circuit, the first selection output circuit may be provided along one of opposite sides of the display area, and the second selection output circuit may be provided along another one of the opposite sides of the display area.

According to a display device of a thirteenth aspect of the disclosure, in the twelfth aspect, the non-display area may be provided with a data driver configured to control driving of the plurality of data signal lines, the plurality of lead wiring lines may include a first lead wiring line and a second lead wiring line electrically coupled to the data driver, the first lead wiring line may be electrically coupled to the data signal trunk line of a demultiplexer included in the first selection output circuit, and the second lead wiring line may be electrically coupled to the data signal trunk line of a demultiplexer included in the second selection output circuit.

According to a display device of a fourteenth aspect of the disclosure, in the first to the thirteenth aspects, constant voltage may be supplied to the second conductive layer.

According to a display device of a fifteenth aspect of the disclosure, in the first to the fourteenth aspect, the display area may be provided with a plurality of high-level power supply lines configured to supply high-level power supply voltage that is constant voltage commonly supplied to the subpixel circuit, and the high-level power supply voltage may be supplied to the second conductive layer.

According to a display device of a sixteenth aspect of the disclosure, in the fifteenth aspect, the plurality of high-level power supply lines may each have at least one of both end portions electrically coupled to the second conductive layer.

According to a display device of a seventeenth aspect of the disclosure, in the second or the third aspect, the display area may be provided with a plurality of high-level power supply lines configured to supply high-level power supply voltage that is constant voltage commonly supplied to the subpixel circuit, the first conductive layer, the second conductive layer, and the third conductive layer may be provided in an island shape in the first slit located closer to a terminal portion provided in the non-display area, the high-level power supply voltage may be supplied to the third conductive layer, with at least one of both end portions electrically coupled to the second conductive layer, and the constant voltage may be supplied to the second conductive layer.

According to a display device of an eighteenth aspect of the disclosure, in the first to the seventeenth aspects, in at least some of the plurality of data signal lines provided in the display area, one of both end portions is electrically coupled to a lead wiring line of the plurality of lead wiring lines and receives a data signal through the lead wiring line.

The disclosure is not limited to each of the embodiments described above, and various modifications may be made within the scope of the claims. Embodiments obtained by appropriately combining technical approaches disclosed in each of the different embodiments also fall within the technical scope of the disclosure. Moreover, novel technical features can be formed by combining the technical approaches disclosed in the embodiments.

The invention claimed is:

1. A display device comprising:
a display area including a plurality of subpixels each including a subpixel circuit including a transistor; and
a non-display area located in a periphery of the display area, where the plurality of subpixels is not formed,
wherein in the display area,
  a first metal layer, including an electrode at a lower layer, is included in the subpixel circuit,
  a first inorganic insulating film is formed at an upper layer of the first metal layer,
  a second metal layer is formed at an upper layer of the first inorganic insulating film and includes an electrode, among electrodes included in the subpixel circuit,
  a second inorganic insulating film is formed at an upper layer of the second metal layer,
  a third metal layer is formed at an upper layer of the second inorganic insulating film and includes an electrode, among the electrodes included in the subpixel circuit,
  a flattening film is formed at an upper layer of the third metal layer, and
  a light-emitting element is formed at an upper layer of the flattening film and includes a first electrode and a second electrode with a light-emitting layer interposed between the first electrode and the second electrode,
the first electrode is formed in an island shape for each of the plurality of subpixels,
the second electrode is formed to extend across the plurality of subpixels,
in the non-display area,
  a slit surrounding at least a part of an outer circumference of the display area is formed in the flattening film,
  in the slit, a lower face of a first conductive layer, located in the same layer as a layer of the first electrode and separated from the first electrode, is in contact with a third conductive layer formed by the third metal layer or the second inorganic insulating film,
  in the slit, the first conductive layer and a second conductive layer formed by the second metal layer overlap with the second inorganic insulating film interposed between the first conductive layer and the second conductive layer,
  the non-display area is further provided with a plurality of lead wiring lines including a wiring line formed by the first metal layer and electrically coupled to a wiring line in the display area, and
  in the slit, the plurality of lead wiring lines overlaps with the second conductive layer with the first inorganic insulating film interposed between the plurality of lead wiring lines and the second conductive layer,
the first conductive layer is provided covering from the flattening film to a bottom surface of the slit, below the bottom surface of the slit, the plurality of lead wiring lines includes one lead wiring line overlapping with the first conductive layer, and the second inorganic insulating film and the first inorganic insulating film are interposed between the one lead wiring line and the first conductive layer,
below the bottom surface of the slit, the second conductive layer is located between the second inorganic insulating film and the first inorganic insulating film, and
the one lead wiring line is electrically separated from the second conductive layer overlapping with the one lead wiring line, and the first inorganic insulating film is interposed between the second conductive layer and the one lead wiring line.

2. The display device according to claim 1,
wherein the non-display area is further provided with a first frame-shaped bank entirely surrounding the outer circumference of the display area and a second frame-shaped bank entirely surrounding an outer side of the first frame-shaped bank,
the slit includes a first slit, and
the first slit is provided between the flattening film and the second frame-shaped bank.

3. The display device according to claim 2,
wherein the first conductive layer is in contact with the third conductive layer in the first slit.

4. The display device according to claim 2, further comprising:
a sealing layer entirely covering the display area,
wherein the sealing layer includes a first inorganic layer, an organic layer formed at an upper layer of the first inorganic layer, and a second inorganic layer formed at an upper layer of the organic layer, and
an edge of the organic layer overlaps with the first frame-shaped bank or the second frame-shaped bank.

5. The display device according to claim 2,
wherein the slit further includes a second slit,
the second slit is provided on an inner circumferential side of the first slit and surrounds a part of the outer circumference of the display area, and
both end portions of the second slit are separated from each other.

6. The display device according to claim 5,
wherein the first conductive layer extends across the first slit and the second slit, and extends along three sides of the outer circumference of the display area.

7. The display device according to claim 5,
wherein a plurality of second conductive layers, including the second conductive layer, is formed at a lower layer of the first slit and the second slit and overlap with each of the first slit and the second slit.

8. The display device according to claim 5,
wherein in the second slit, the first conductive layer is in contact with the second electrode, and the second electrode and the third conductive layer are electrically coupled to each other by interposing the first conductive layer.

9. The display device according to claim 5,
wherein the display area is provided with a plurality of data signal lines configured to supply a data signal to the plurality of subpixels, a plurality of gate lines configured to scan the plurality of subpixels, and a plurality of light emission control lines,
the plurality of gate lines and the plurality of light emission control lines intersect with the plurality of data signal lines, and a scanning driver extending along one side of the display area and configured to control driving of at least one of the plurality of gate lines and the plurality of light emission control lines is provided in the non-display area between the display area and the first slit.

10. The display device according to claim 9,
wherein the scanning driver is provided to extend across the second slit, and includes
a first driver transistor that is a transistor provided on an outer side of the second slit that is a side farther from the display area than the second slit,
a second driver transistor that is a transistor provided on an inner side of the second slit that is a side closer to the display area than the second slit, and
the first driver transistor and the second driver transistor are coupled to each other through a driver wiring line that is a wiring line in the same layer as a layer of the plurality of lead wiring lines and intersects with the second slit.

11. The display device according to claim 9,
wherein the non-display area is further provided with a selection output circuit including a plurality of demultiplexers configured to combine the plurality of data signal lines provided in the display area into a data signal trunk line, and the selection output circuit is provided along a side of the display area extending in a direction intersecting with the plurality of data signal lines.

12. The display device according to claim 11,
Wherein the selection output circuit includes a first selection output circuit arranged opposite a side of the display area closer to a terminal portion provided in the non-display area and a second selection output circuit arranged opposite to a side of the display area farther from the terminal portion,
the first selection output circuit is provided along one of opposite sides of the display area, and
the second selection output circuit is provided along another one of the opposite sides of the display area.

13. The display device according to claim 12,
wherein the non-display area is further provided with a data driver configured to control driving of the plurality of data signal lines,
the plurality of lead wiring lines includes a first lead wiring line and a second lead wiring line electrically coupled to the data driver,
the first lead wiring line is electrically coupled to the data signal trunk line of a demultiplexer included in the first selection output circuit, and
the second lead wiring line intersects with the slit and is electrically coupled to the plurality of data signal lines in the display area.

14. The display device according to claim 1,
wherein a constant voltage is supplied to the second conductive layer.

15. The display device according to claim 1,
wherein the display area is provided with a plurality of high-level power supply lines configured to supply a high-level power supply voltage that is a constant voltage commonly supplied to the subpixel circuit, and
the high-level power supply voltage is supplied to the third conductive layer.

16. The display device according to claim 15,
wherein each of the plurality of high-level power supply lines has at least one of both end portions electrically coupled to the second conductive layer.

17. The display device according to claim 2,
wherein the display area is provided with a plurality of high-level power supply lines configured to supply a high-level power supply voltage that is a constant voltage commonly supplied to the subpixel circuit,
the first conductive layer, the second conductive layer, and the third conductive layer are provided in an island shape in the first slit located closer to a terminal portion provided in the non-display area,
the high-level power supply voltage is supplied to the third conductive layer, with at least one of both end portions electrically coupled to the second conductive layer, and
the constant voltage is supplied to the second conductive layer.

18. The display device according to claim 1,
wherein in at least some of the plurality of data signal lines provided in the display area, one of both end portions is electrically coupled to a lead wiring line of the plurality of lead wiring lines and receives a data signal through the lead wiring line.

* * * * *